United States Patent [19]

Hutcheson

[11] 4,170,677

[45] Oct. 9, 1979

[54] ANISOTROPIC RESISTANCE BONDING TECHNIQUE

[75] Inventor: Edward T. Hutcheson, Stafford, Va.

[73] Assignee: The United States of America as represented by the Secretary of the Army, Washington, D.C.

[21] Appl. No.: 852,113

[22] Filed: Nov. 16, 1977

[51] Int. Cl.² .............................................. B29C 19/06
[52] U.S. Cl. .................................... 428/119; 156/272; 252/511; 252/512; 361/42; 428/86; 428/120; 428/221; 428/901
[58] Field of Search ................. 428/221, 86, 119, 120, 428/901; 252/511, 512; 156/272; 361/42; 29/625

[56] References Cited

U.S. PATENT DOCUMENTS

| | | | |
|---|---|---|---|
| 3,359,145 | 12/1967 | Salyer | 156/1 |
| 3,580,776 | 5/1971 | Shenfil | 156/330 |
| 3,801,427 | 4/1974 | Morishita | 428/901 |
| 3,940,534 | 2/1976 | Fick | 428/901 |
| 3,958,317 | 5/1976 | Peart | 428/901 |

Primary Examiner—Marion E. McCamish
Attorney, Agent, or Firm—Nathan Edelberg; Milton W. Lee; Aubrey J. Dunn

[57] ABSTRACT

A method of making electrical connections between large-scale integrated circuit boards or the like using a plastic adhesive charged with conductive particles. The method includes the steps of: coating one board with the adhesive, placing another board on the adhesive coating, applying a field to make the conductive whiskers align perpendicular to the boards, and hardening the adhesive while the field is applied. The field may be electric or magnetic, depending on whether the whiskers are paramagnetic or ferromagnetic.

9 Claims, 2 Drawing Figures

ANISOTROPIC RESISTANCE BONDING TECHNIQUE

The invention described herein may be manufactured, used, and licensed by the U.S. Government for governmental purposes without the payment of any royalties thereon.

BACKGROUND OF THE INVENTION

There are applications in the electronics art that require electrical connections between planes of separate planar electronics circuits. These circuits are commonly known as integrated circuits and include various active and passive electrical elements such as resistors, transistors, etc. The connections have heretofore been made by such means as descrete wiring or equivalent or by solder bumps. Discrete wiring usually requires that conductors on the boards be connected to edge connectors, to which multiple-connector jacks or sockets are connected. Individual wire or equivalent conductors between jacks or socket connectors thus provide the desired interconnection between boards. Obviously, this means wastes much circuit board area, introduces extra circuit impedances, is costly, and requires much room for jacks or sockets. A more efficient means in terms of space, cost, and impedance is solder bumps. In this technique, one of the circuit boards is masked, and bumps of a low-temperature solder are deposited through holes in the mask. The mask is then removed and the boards are placed with corresponding surfaces in accurately aligned contact. When a sufficient quantity heat is applied, the solder bumps melt and establish connections between the boards. This technique produces a circuit board sandwich that is susceptable to failures of the solder connections from unequal thermal expansion of the boards. Moreover, quite accurate initial alignment of the boards is required.

My invention overcomes the disadvantages of the means described above since it requires no masking steps, requires little if any, more space that solder bumps require, does not require as accurate alignment as solder bumps, needs no external or extra internal wires or connectors, and uses an adhesve flexible enough to withstand normal circuit board thermal movements.

SUMMARY OF THE INVENTION

The invention is a method of making electrical connections between surfaces, such as integrated circuit boards, having conductive areas and insulating areas, a method of producing an anisotropic conductor, and the products as produced by the methods. The first-mentioned method includes the steps of: coating on surface with a conductive-whisker charged plastic adhesive, placing the other surface on the coatng, applying an aligning field to the coating to make the whiskers align perpendicular to surface, and hardening the adhesive while the field is applied. The other method includes the steps of: mixing together a plastic insulator and conductive whiskers, forming the mixture to a desired shape, applying an aligning field to the mixture whereby the whiskers align parallel to each other, and hardening the mixture while the field is applied. In either method, the step of applying the aligning field may be interchanged with the immediately preceeding step.

DETAILED DESCRIPTION OF THE INVENTION

Figure 1:
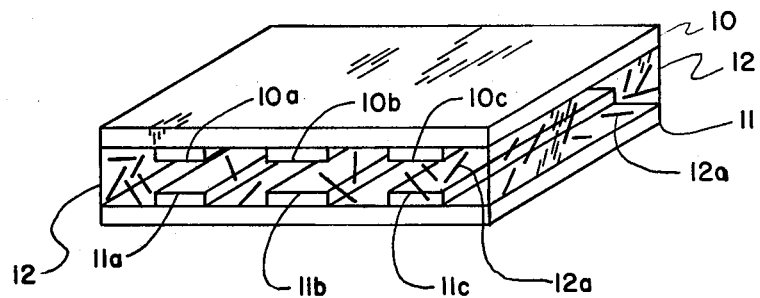
FIG. 1 shows a schematic drawing of the invention, before the whiskers are aligned.
Figure 2:
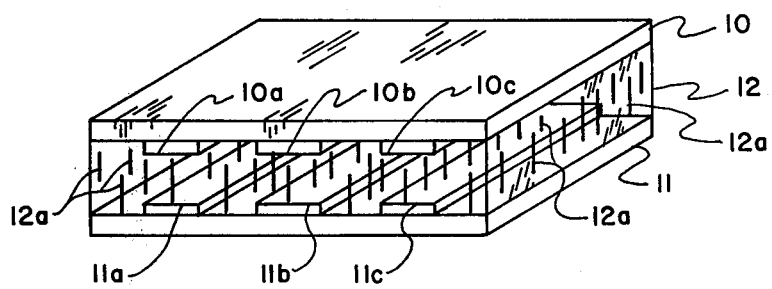
FIG. 2 shows the FIG. 1 embodiment after the whiskers are aligned.

The invention may be best understood when taken in conjunction with the drawings. FIG. 1, for example, shows surfaces having conductive areas and insulating areas such as circuit boards 10 and 11 with respective circuit elements 10a, 10b, 10c, and 11a, 11b, 11c thereon. One of the surface is coated with a plastic 12 charged with a chaff of conductive whiskers 12a. The other surface is then placed on 12 to produce a board-adhesive sandwich. An aligning field is then applied to the sandwich to make the whiskers align perpendicular to the surface, as shown in FIG. 2. Adhesive 12 is hardened, the field is removed, and the invention is complete.

In the case of paramagnetic whiskers, the aligning field is electric with its lines perpendicular to the surfaces. For ferromagnetic whiskers, the field is magnetic with its lines of flux perpendicular to the parallel surface.

Adhesive 12 may be chosen from various flexible or semiflexible curable and insulating adhesives, such as thermosetting plastics or the various epoxy resins, etc. with heat or curing agents for curing. Typical whisker lengths would be on the order of a few micrometers and whiskers diameters of the order of tenths of micrometers.

The invention also includes a method for producing an anisotropic conductor from a plastic insulator and conductive whiskers and includes the steps of; mixing together the insulator and the whiskers, forming the mixture to a desired shape, applying an aligning field to the mixture to align the whiskers parallel to each other, and hardening the plastic while the field is applied.

While a specific embodiment of the invention has been shown and described, other embodiments may be obvious to ones skilled in the art, in view of this description. For example, the aligning field may be applied before the sandwich is completed, or before the mixture for the anisotropic conductor is formed to a desired shape, or the boards may be placed adjacent each other and the adhesive injected therebetween before the aligning field is applied. The conductive whiskers may be good conductors such as copper, gold, or silver, or ferromagnetic metals such as iron or nickle, or other conductors such as graphite. Moreover, melted thermoplastic adhesives may be used, and allowed to freeze while the aligning field is applied. Although I have described my invention as applicable to printed circuit boards, it is obviously applicable to two surfaces having conductive areas and insulating areas, using the same method steps as for printed circuit boards.

I claim:

1. A method of making electrical connections between two surfaces, wherein each surface has conductive areas and insulating areas including the the steps of:
    (a) coating one surface with a plastic adhesive charged with paramagnetic conductive whiskers;
    (b) placing the other surface on said coating;

(c) applying an aligning electric field to said coating to cause said whiskers to align perpendicular to said surfaces; and (d) hardening said adhesive while said field is applied.

2. The method of claim 1 wherein steps (c) and (b) are interchanged.

3. The product produced by the method of claim 1.

4. A method of producing an anisotropic conductor from a plastic insulator and paramagnetic conductive whiskers and including the steps of:

(a) mixing together said insulator and said whiskers;

(b) forming the mixture to a desired shape;

(c) applying an aligning electric field to the mixture whereby the whiskers align parallel to each other; and (d) hardening said plastic while said field is applied.

5. The method as set forth in claim 4 wherein steps (b) and (c) are interchanged.

6. The product as produced by the method of claim 4.

7. A method of making electrical connections between integrated circuit boards, including the steps of:

(a) coating one board with a paramagnetic whisker charged plastic adhesive;

(b) placing another board on the coating;

(c) applying an aligning electric field whereby the whiskers align between the boards and normal thereto; and (d) hardening the adhesive while the field is applied.

8. The method as set forth in claim 7 wherein steps (b) and (c) are interchanged.

9. The product as produced either by the method of claim 7.

* * * * *

UNITED STATES PATENT AND TRADEMARK OFFICE
CERTIFICATE OF CORRECTION

PATENT NO. : 4,170,677
DATED : October 9, 1979
INVENTOR(S) : Edward T. Hutcheson It is certified that error appears in the above-identified patent and that said Letters Patent are hereby corrected as shown below:

Claim 9 should read as follows:

--9. The product as produced either by the method of Claim 7 or Claim 8.--

Signed and Sealed this

Twenty-second Day of January 1980

[SEAL]

Attest:

SIDNEY A. DIAMOND

Attesting Officer

Commissioner of Patents and Trademarks